(12) United States Patent
Osono et al.

(10) Patent No.: US 10,000,850 B2
(45) Date of Patent: Jun. 19, 2018

(54) DEPOSITION METHOD AND METHOD OF MANUFACTURING A CATALYST WIRE FOR A CATALYTIC CHEMICAL VAPOR DEPOSITION APPARATUS

(71) Applicant: Ulvac, Inc., Chigasaki-shi, Kanagawa (JP)

(72) Inventors: Shuji Osono, Sammu (JP); Masanori Hashimoto, Sammu (JP); Shin Asari, Sammu (JP)

(73) Assignee: Ulvac, Inc., Chigasaki-Shi (JP)

( * ) Notice: Subject to any disclaimer, the term of this patent is extended or adjusted under 35 U.S.C. 154(b) by 232 days.

(21) Appl. No.: 14/939,017

(22) Filed: Nov. 12, 2015

(65) Prior Publication Data

US 2016/0060764 A1 Mar. 3, 2016

Related U.S. Application Data

(63) Continuation of application No. 13/133,230, filed as application No. PCT/JP2008/072353 on Dec. 9, 2008, now abandoned.

(51) Int. Cl.

| | |
|---|---|
| *C23C 18/02* | (2006.01) |
| *C23C 8/08* | (2006.01) |
| *C23C 16/24* | (2006.01) |
| *C23C 16/34* | (2006.01) |
| *C23C 16/448* | (2006.01) |
| *C23C 16/06* | (2006.01) |
| *C23C 16/46* | (2006.01) |

(52) U.S. Cl.
CPC ............... *C23C 18/02* (2013.01); *C23C 8/08* (2013.01); *C23C 16/06* (2013.01); *C23C 16/24* (2013.01); *C23C 16/345* (2013.01); *C23C 16/4488* (2013.01); *C23C 16/46* (2013.01)

(58) Field of Classification Search
None
See application file for complete search history.

(56) References Cited

U.S. PATENT DOCUMENTS 2,528,454 A * 10/1950 Schlesinger ............ C23C 16/01
148/279
3,024,176 A 3/1962 Cook
(Continued)

FOREIGN PATENT DOCUMENTS

| JP | 2002299259 A | 10/2002 |
|---|---|---|
| JP | 2003247063 | 9/2003 |

(Continued)

*Primary Examiner* — Joseph A Miller, Jr.
(74) *Attorney, Agent, or Firm* — Harness, Dickey & Pierce, P.L.C.

(57) ABSTRACT

A catalytic chemical vapor deposition apparatus comprising a catalyst wire including a tantalum wire and a boride layer formed on a surface of the tantalum wire is used. The boride of the metal tantalum (tantalum boride) is harder than the metal tantalum. Therefore, by using the tantalum wire having the boride layer formed on the surface thereof as a catalyst wire, it is possible to reduce thermal expansion of the catalyst wire, improve mechanical strength, and prolong the service life. Further, by performing energization heating of the catalyst wire by continuous energization, it is further possible to prolong the service life of the catalyst wire.

2 Claims, 4 Drawing Sheets

(56) References Cited

U.S. PATENT DOCUMENTS

| | | | | |
|---|---|---|---|---|
| 3,251,719 | A | * | 5/1966 | Tepper .................. C23C 10/22 |
| | | | | 148/245 |
| 3,650,846 | A | | 3/1972 | Holland et al. |
| 5,571,332 | A | | 11/1996 | Halpern |
| 2009/0023274 | A1 | | 1/2009 | Cao et al. |

FOREIGN PATENT DOCUMENTS

| | | |
|---|---|---|
| JP | 2003247069 A | 9/2003 |
| JP | 2003303780 | 10/2003 |

* cited by examiner

US 10,000,850 B2

DEPOSITION METHOD AND METHOD OF MANUFACTURING A CATALYST WIRE FOR A CATALYTIC CHEMICAL VAPOR DEPOSITION APPARATUS

CROSS-REFERENCE TO RELATED APPLICATIONS

This application is a continuation of U.S. National Phase patent application Ser. No. 13/133,230 filed on Jun. 7, 2011 which claims priority to International Application No. PCT/JP2008/072353, filed Dec. 9, 2008. The entire disclosures of each of the above applications are incorporated herein by reference.

FIELD

The present invention relates to a catalytic chemical vapor deposition apparatus that supplies a source gas to a heated catalyst wire installed in a reaction chamber and deposits generated decomposition species on a base material to be film-formed in the reaction chamber, to thereby perform film formation.

BACKGROUND

Catalytic-chemical vapor deposition (CAT-CVD) is a film formation method of supplying a reactive gas (source gas) to a catalyst wire heated to, for example, 1,500 to 2,000° C. and depositing decomposition species (deposited species) generated using catalysis or thermal decomposition reaction of the reactive gas on a base material to be film-formed.

The catalytic-chemical vapor deposition is similar to plasma CVD in that decomposition species of a reactive gas are deposited on a base material to thereby perform film formation. However, in the catalytic-chemical vapor deposition, decomposition species are generated using catalysis or thermal decomposition reaction of the reactive gas on a catalyst wire having a high temperature. Therefore, the catalytic-chemical vapor deposition has an advantage that surface damage due to plasma is not caused and a use efficiency of a source gas is high, as compared to the plasma CVD in which plasma is formed to generate decomposition species of a reactive gas.

For example, the catalytic-chemical vapor deposition is used when a silicon (Si)-based film is formed. Conventionally, for a catalyst wire used in the catalytic-chemical vapor deposition, a tungsten (W) wire is widely used (see, for example, Patent Document 1). However, tungsten is prone to undergo an alloying reaction with silicon (silicidation). When tungsten is silicided, cracks are generated on the surface and the mechanical strength is reduced, which shortens the service life of the catalyst wire.

On the other hand, examples of a material having a lower silicidation speed than that of tungsten include tantalum (Ta). There is a method of using a tantalum wire as a catalyst wire to form a silicon film (see, for example, Patent Document 2).

Patent Document 1: Japanese Patent Application Laid-open No. 2003-303780

Patent Document 2: Japanese Patent Application Laid-open No. 2003-247062.

SUMMARY

Problem to be Solved by the Invention

It is known that tantalum has lower mechanical strength than that of tungsten, and particularly has low creep strength when used in high temperature. Therefore, in the case where metal tantalum is used for a catalyst wire, there arise problems that thermal expansion is caused at a time of heating, and accordingly a wire diameter is made small and wire resistance is made large, a wire temperature is raised, and blowout is prone to occur. Therefore, it is impossible to improve productivity.

Further, Patent Document 2 discloses a catalyst wire obtained by coating a surface of a tantalum wire with boron nitride (BN). However, the coating with boron nitride is insufficient to prolong the service life of the tantalum catalyst wire, and further improvement is demanded.

The present invention has been made in view of the problems described above and has an object to provide a catalytic chemical vapor deposition apparatus capable of prolonging the service life of a catalyst wire.

Means for Solving the Problem

According to an embodiment of the present invention, there is provided a catalytic chemical vapor deposition apparatus including a reaction chamber, a gas introduction source, a catalyst wire, and a heat source.

The gas introduction source introduces a source gas to the reaction chamber.

The catalyst wire includes a tantalum wire and a boride layer formed on a surface of the tantalum wire and is arranged to be opposed to a substrate to be processed that is installed in the reaction chamber.

The heat source heats the catalyst wire.

DRAWINGS

Figure 3A:
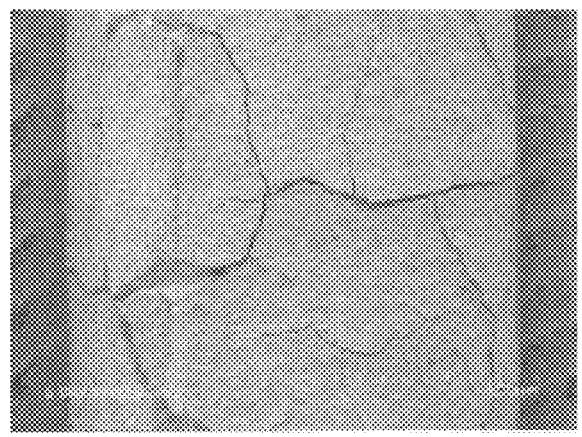
Figure 3B:
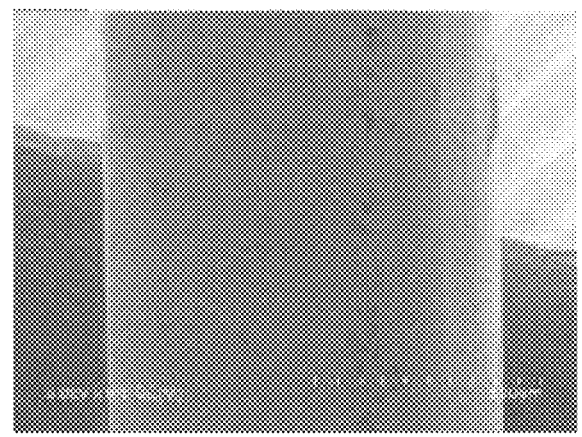
Figure 4:
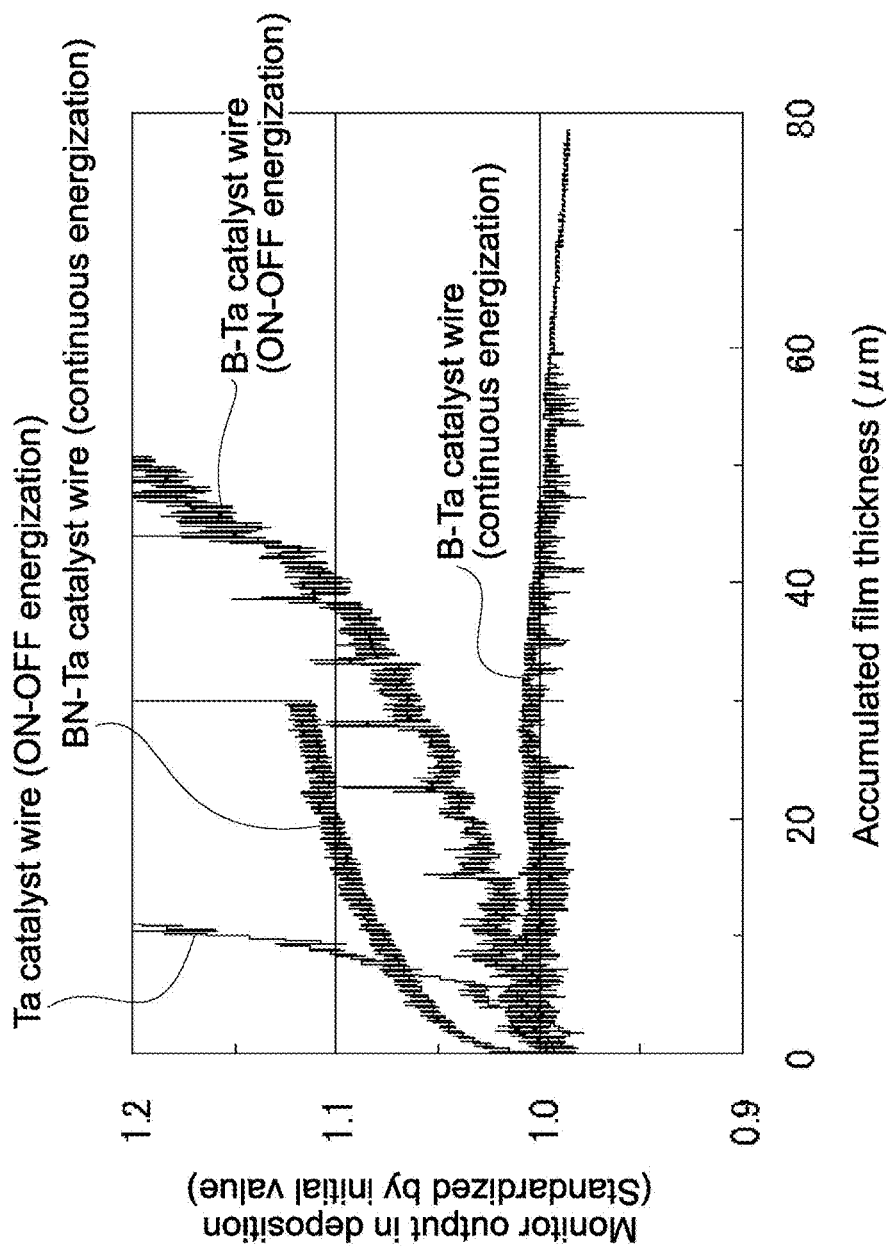

FIGS. 3A and 3B are photographs of a side view (SEM) showing a surface condition of a catalyst wire installed in the reaction chamber wherein FIG. 3A is shown in a state where surface cracks are generated and FIG. 3B is shown in a state where surface cracks are not generated; and FIG. 4 is a diagram showing durability of various samples of catalyst wires described in Examples of the present invention.

DETAILED DESCRIPTION

According to an embodiment of the present invention, there is provided a catalytic chemical vapor deposition apparatus including a reaction chamber, a gas introduction source, a catalyst wire, and a heat source.

The gas introduction source introduces a source gas to the reaction chamber.

The catalyst wire includes a tantalum wire and a boride layer formed on a surface of the tantalum wire and is arranged to be opposed to a substrate to be processed that is installed in the reaction chamber.

The heat source heats the catalyst wire.

According to the structure described above, the boride of the metal tantalum (tantalum boride) is harder than the metal tantalum. Therefore, by using the tantalum wire having the boride layer formed on the surface thereof as a catalyst wire, it is possible to reduce thermal expansion of the catalyst wire, improve the mechanical strength, and prolong the service life. Further, according to the structure described above, the service life can be prolonged as compared to a catalyst wire obtained by coating the surface of the tantalum wire with boron nitride or carbon.

As a method of forming a boride layer on a surface of a tantalum wire, a tantalum wire is installed in a reaction chamber and is subjected to energization heating while a diborane ($B_2H_6$) gas is introduced in the reaction chamber. A film thickness of a boride layer is not particularly limited and can be adjusted as appropriate based on a heating temperature of the tantalum wire, a gas concentration of the diborane gas, a reaction time, or the like.

The catalytic chemical vapor deposition apparatus may further include a control means for performing energization heating of the catalyst wire with the heat source by continuous energization.

According to the structure described above, the tantalum wire having the boride layer formed on the surface thereof is used as a catalyst wire and subjected to energization heating to perform film formation. At this time, the control means for performing energization heating of the catalyst wire by continuous energization is installed and the energization heating of the catalyst wire is successively performed during film formation, with the result that a heat shock given to the catalyst wire can be relieved, the generation of cracks on the boride layer can be suppressed, and the service life of the catalyst wire can be prolonged.

Hereinafter, embodiments of the present invention will be described with reference the drawings.

Figure 1:
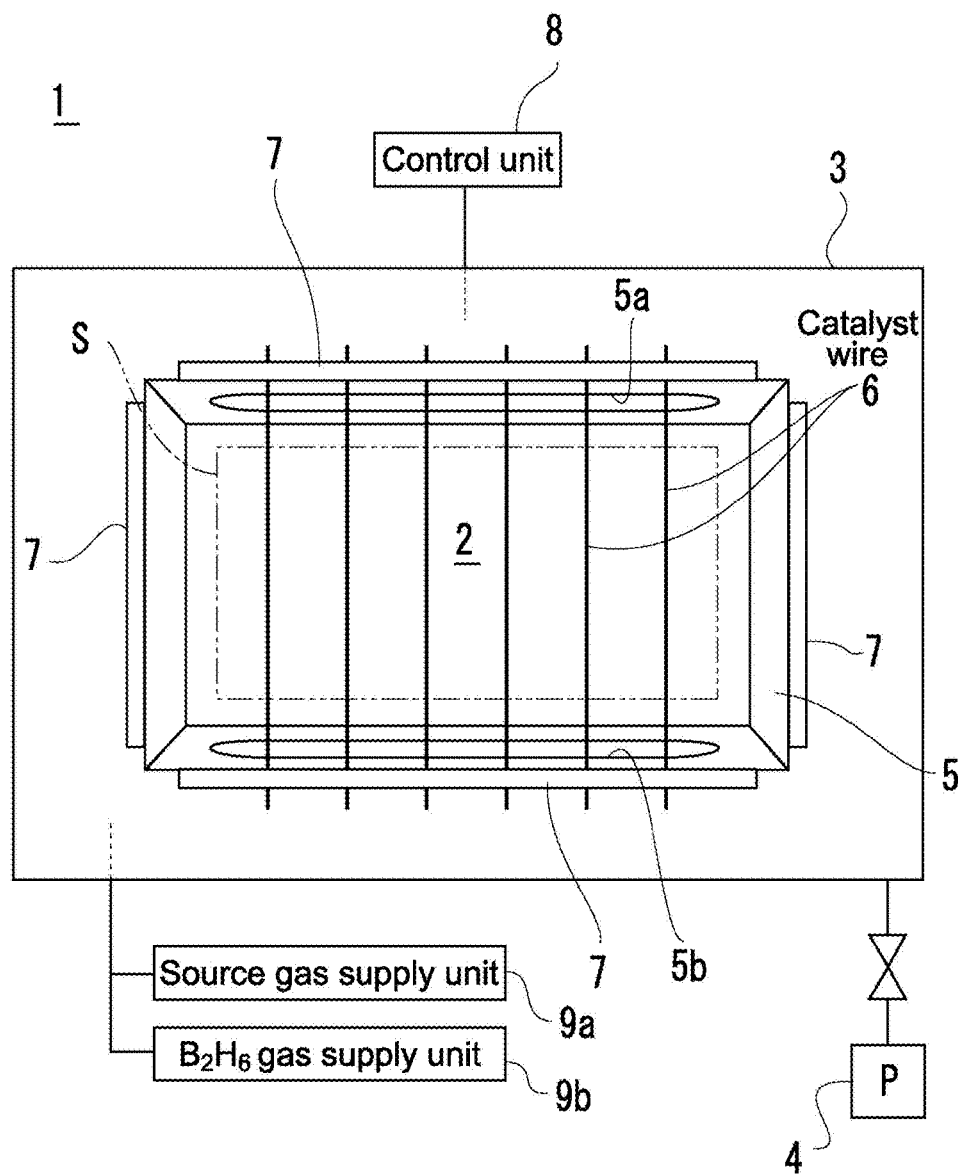
FIG. 1 is a schematic structural view of a catalytic chemical vapor deposition apparatus according to an embodiment of the present invention.

FIG. 1 is a schematic structural view of a catalytic chemical vapor deposition apparatus according to an embodiment of the present invention. A catalytic chemical vapor deposition apparatus 1 includes a vacuum chamber 3 in which a reaction chamber 2 is formed. To the vacuum chamber 3, a vacuum pump 4 is connected so that the reaction chamber 2 can be evacuated to a predetermined degree of vacuum. The reaction chamber 2 is formed inside an anti-adhesive plate 5 installed in the vacuum chamber 3.

Inside the reaction chamber 2 partitioned by the anti-adhesive plate 5, a plurality of catalyst wires 6 are installed. The catalyst wires 6 are each constituted of a tantalum (Ta) wire. In this embodiment, the plurality of catalyst wires 6 are set parallel to each other so as to cross the inside of the reaction chamber 2 in a vertical direction. It should be noted that the installation form of the catalyst wires 6 is not limited to the above-mentioned vertical direction, and the catalyst wires 6 may be installed in a form of crossing the reaction chamber 2 in a horizontal direction.

The respective catalyst wires 6 are installed so as to pass through through-holes 5a and 5b formed on a top surface and a bottom surface of the anti-adhesive plate 5, and both end portions thereof are connected to a control unit 8 (control means) set outside the vacuum chamber 3. The control unit 8 includes a heat source to perform energization heating on the catalyst wires 6. The control unit 8 is for performing energization heating of the catalyst wires 6 by continuous energization, and is constituted of a computer or the like that adjusts a current supply source and supply current.

Figure 2:
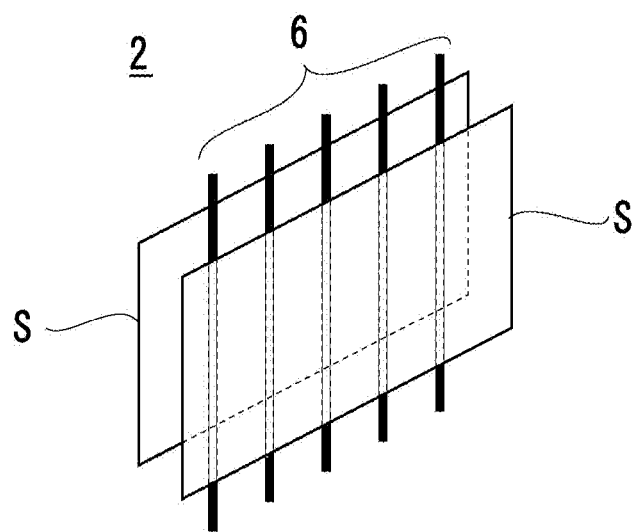
FIG. 2 is a schematic perspective view of a reaction chamber of the apparatus shown in FIG. 1.

Inside the reaction chamber 2, a substrate S serving as a base material to be film-formed is set. For the substrate S, for example, a rectangular glass substrate is used. In this embodiment, as shown in FIG. 2, two substrates S are opposed to each other so as to sandwich the catalyst wires 6 therebetween. Here, the substrates S are installed in the reaction chamber 2 such that a long side direction of the substrates S is orthogonal to an extending direction of the catalyst wires 6. It should be noted that the substrates S are supported by a substrate support means (not shown). The substrate support means has a structure incorporating a heat source to heat the substrates S to a predetermined temperature.

The anti-adhesive plate 5 has a substantially rectangular solid shape, and gas introduction pipes 7 are installed at four side portions of the anti-adhesive plate 5. The gas introduction pipes 7 are for introducing a source gas or a diborane ($B_2H_6$) gas to the reaction chamber 2, and are connected to a source gas supply unit 9a and a diborane gas supply unit 9b installed outside the vacuum chamber 3 via a gas supply line. The source gas or diborane gas ejected from the gas introduction pipes 7 is mainly introduced between the two substrates S. It should be noted that a gas introduction source is constituted of the source gas supply unit 9a, the gas introduction pipes 7, and the like.

The catalytic chemical vapor deposition apparatus 1 is constituted as described above. Next, the catalytic-chemical vapor deposition of this embodiment using the catalytic chemical vapor deposition apparatus 1 will be described.

(First Embodiment)

First, the vacuum pump 4 is operated to evacuate the vacuum chamber 3 and reduce a pressure of the reaction chamber 2 to a predetermined degree of vacuum (for example, 1 Pa). Next, a diborane gas is introduced from the diborane gas supply unit 9b to the reaction chamber 2 and the catalyst wires 6 are energized by the control unit 8 to be heated to a predetermined temperature (for example, 1,700° C.) or more. At this time, due to contact of the diborane gas with a surface of the catalyst wire 6, a tantalum boride layer as a reaction product is formed on the surface of the catalyst wire 6.

Since the tantalum wire having the boride layer formed on the surface as described above is harder than a metal tantalum wire, by using the tantalum wire having the boride layer formed on the surface thereof as a catalyst wire, it is possible to reduce thermal expansion of the catalyst wires 6 and improve the mechanical strength to prolong the service life. It should be noted that a film thickness of the boride layer is not particularly limited and can be adjusted as appropriate based on a heating temperature of the tantalum wire, a gas concentration of the diborane gas, a reaction time, or the like.

It should be noted that the step of forming a boride layer on the surface of the tantalum wire may be performed after the substrates S are installed in the vacuum chamber 3, or may be performed before the substrates S are installed therein. Further, in a chamber to which a diborane gas supply line cannot be provided, a catalyst wire of tantalum boride whose boride layer is formed in advance somewhere else may be relocated.

Next, after the introduction of the diborane gas is stopped, a source gas is introduced from the source gas supply unit 9a to the reaction chamber 2. In this embodiment, a mixed gas of a silane ($SiH_4$) gas and hydrogen ($H_2$) is used as a source gas to form a silicon (Si) film on the surface of the substrate S. It should be noted that a film to be formed on the surface of the substrate S may be a silicon nitride film (SiN) formed using silane, hydrogen, and ammonia ($NH_3$), a silicon nitride film formed using trisilylamine (($SiH_3$)$_3$N), ammonia, and hydrogen, a silicon nitride film formed using hexamethyldisilazane (($CH_3$)$_3$SiNHSi($CH_3$)$_3$, abbreviated to HMDS), a silicon oxide film (SiO) formed using silane, hydrogen, and oxygen ($O_2$) or dinitrogen monoxide ($N_2O$), a silicon oxide film formed using silane and tetraethoxysilane (Si($OC_2H_5$)$_4$, abbreviated to TEOS), a phosphorus-doped silicon film (n+Si film) or a boron-doped silicon (p+Si film) formed using silane, hydrogen, and phosphine ($PH_3$) or diborane, a silicon carbide film formed using silane, hydrogen, and acetylene or methane, a silicon germane film formed using silane, hydrogen, and germane, a polytetrafluoroethylene (registered trademark "Teflon") film formed using silane and hexafluoropropylene oxide (abbreviated to HFPO), or the like. It should be noted that in the case of performing hydrogen treatment using a hydrogen gas, it is possible to achieve objects to remove a termination of a defect in a silicon film or a natural oxide film. Further, in the case of performing nitriding treatment using an ammonia gas, it is possible to nitride silicon.

Specifically, in the film formation step of the substrates S, a DC voltage is applied to the catalyst wires 6 by the by the control unit 8, and the catalyst wires 6 are heated to high temperature of, for example, 1,700° C. or more. Further, at this time, the substrates S are heated to a predetermined temperature (for example, about 300° C.). The source gas is introduced between the two substrates S opposed to each other from the gas introduction pipes 7. Then, the source gas comes into contact with the catalyst wires 6 heated to high temperature, and decomposition species of a reactive gas generated by catalysis or thermal decomposition reaction are deposited on the substrate S so that a film is formed.

Here, when the energization heating of the catalyst wires 6 is performed by an on/off operation of applied current, a heat shock (expansion due to heating or contraction due to cancel of heating) given to the catalyst wires 6 becomes large. Therefore, cracks are prone to be generated on the surface of the catalyst wires 6 and the mechanical strength is lowered. In this regard, in this embodiment, a heating temperature of the catalyst wires 6 is controlled while the energization heating of the catalyst wires 6 is successively performed by the control unit 8 at a time of film formation of the substrate S so that the heat shock given to the catalyst wires 6 is reduced.

As the energization control method for the catalyst wire by the control unit 8, a method of increasing/decreasing temperature of the catalyst wires 6 in a plurality of steps (lamp-up/down) is included in addition to a method of continuously controlling a current amount and keeping the catalyst wires 6 to be heated to a predetermined temperature. By those methods, it is possible to suppress the generation of cracks on the boride layer formed on the surface of the catalyst wire 6 and improve the mechanical strength.

As described above, according to this embodiment, by using the tantalum wire having the boride layer formed on the surface thereof as the catalyst wire 6, it is possible to reduce the thermal expansion of the catalyst wire 6, improve the mechanical strength, prolong the service life, and improve the productivity. Further, since the catalyst wire is formed of a material mainly composed of tantalum, it is possible to suppress an alloying reaction with the source gas (silicidation) and realize stable film formation.

In addition, according to this embodiment, by successively performing the energization heating of the catalyst wire 6 during film formation, it is possible to relieve the heat shock given to the catalyst wire, suppress the generation of cracks on the superficial boride layer, and prolong the service life of the catalyst wire. FIGS. 3A and 3B are SEM pictures each showing a side surface of a catalyst wire having a boride layer formed on a surface thereof. FIG. 3A shows an example in which energization heating is intermittently performed (by on/off operation), and it is apparent that surface cracks are generated. Further, FIG. 3B shows an example in which energization heating is successively performed, and the generation of surface cracks is not found.

(Second Embodiment)

Next, catalytic-chemical vapor deposition according to a second embodiment of the present invention will be described.

The substrates S and tantalum wires serving as the catalyst wires 6 are installed in the reaction chamber 2. Then, the vacuum pump 4 is operated to evacuate the vacuum chamber 3, and the pressure of the reaction chamber 2 is reduced to a predetermined degree of vacuum (for example, 1 Pa). Next, a source gas and a diborane gas are introduced to the reaction chamber 2 from the source gas supply unit 9a and the diborane gas supply unit 9b via the gas introduction pipes 7, and the respective catalyst wires 6 are energized by the control unit 8 and heated to a predetermined temperature (for example, 1,700° C.) or more.

The diborane gas introduced to the reaction chamber 2 comes into contact with the catalyst wires 6 and is decomposed so that a boride (tantalum boride) layer is formed on the surface of each catalyst wire 6. Accordingly, the surface of the catalyst wire 6 is cured, with the result that the thermal expansion is reduced, the mechanical strength is improved, and the service life is prolonged.

On the other hand, the source gas introduced to the reaction chamber 2 comes into contact with the catalyst wires 6 and is decomposed so that reaction products thereof (decomposition species) are deposited on the surface of the substrate S. Accordingly, a silicon film is formed on the surface of the substrate S. It should be noted that silicon as decomposition species of the source gas has a lower vapor pressure than that of boron (B), and does not adhere to the catalyst wire 6 or adheres thereto and then evaporates immediately under a reduced-pressure atmosphere of 1 Pa and a high temperature state of 1,700° C. or more. Therefore, a silicon film is not deposited on the surface of the catalyst wire 6 and the boride layer formed on the surface of the catalyst wire 6 is not affected.

It should be noted that also in this embodiment, the energization heating of the catalyst wire 6 by the control unit 8 is successively performed. Accordingly, it is possible to suppress the generation of surface cracks of the catalyst wire 6 in the step of forming a boride layer of the catalyst wire 6 and the film formation step, and improve the mechanical strength and durability of the catalyst wire 6 to improve the productivity.

According to this embodiment, the same effect as that of the first embodiment described above can be obtained. Particularly, according to this embodiment, it is possible to perform the film formation step of a silicon film on the substrate S simultaneously with the step of forming the boride layer on the surface of the catalyst wire, with the result that the productivity can be improved more.

EXAMPLES

Three types of catalyst wires having different structures were used to perform a film formation test of Si, and the durability of the respective catalyst wires was evaluated. Results thereof are shown in FIG. 4. In the figure, the vertical axis indicates a monitor output (voltage value), and the horizontal axis indicates an accumulated film thickness. In other words, FIG. 4 shows a relationship between expansion of the catalyst wire and a time.

The catalyst wires used in the experiment were a Ta catalyst wire (Sample 1) formed of a metal tantalum wire (99.5% pure) that is formed into a U shape and has a diameter of 1 mm and a length of 3,000 mm, a B-Ta catalyst wire (Sample 2) obtained by boriding a surface of the tantalum wire described above, and a BN-Ta catalyst wire (Sample 3) obtained by coating the surface of the tantalum wire described above with boron nitride. As energization methods for the catalyst wires, intermittent energization was performed for the Sample 1 (ON-OFF energization), continuous energization and intermittent energization were performed for the Sample 2, and continuous energization was performed for the Sample 3.

Initial conditions for boriding the Sample 2 are as follows.
Flow rate of diborane ($B_2H_6$) gas: 160 sccm
Applied power: 3 kW (monitor current value: about 30A)
Pressure: 2 Pa
Conditions for a film formation test are as follows.
Flow rate of monosilane ($SiH_4$) gas: 32 sccm
Flow rate of hydrogen ($H_2$) gas: 16 sccm
Applied power: 3 kW (monitor current value: about 30 A)
Pressure: 2 Pa As shown in FIG. 4, the Sample 1 (Ta catalyst wire) was expanded abruptly from the start of film formation and leaded to rupture. The expansion amount exceeded 20%.

In contrast to this, as to the Sample 2 (B-Ta catalyst wire), the durability was largely improved as compared to the Sample 1. Particularly, at a time of continuous energization, deformation was hardly found from the start of film formation. On the other hand, at the time of intermittent energization, expansion was gradually caused from the start of film formation, which leaded to rupture eventually. This may be caused because cracks were generated on the surface due to a heat shock at the time of turning current ON/OFF. The expansion at the time of rupture exceeded 10%, but the durability was improved five times or more as compared to the Sample 1.

Next, as to the Sample 3 (BN-Ta catalyst wire), expansion was gradually caused from the start of film formation, which leaded to rupture eventually. The expansion at the time of rupture exceeds 10%, but the durability was improved about three times as compared to the Sample 1. However, the durability was inferior to that of the Sample 2 at the time of intermittent energization. The change of the expansion is different from that of the Sample 2 at the time of intermittent energization. This may be because the Sample 3 has lower surface hardness than that of the Sample 2.

As is apparent from the results described above, the catalyst wire (Sample 2) having the boride layer formed on the surface of the tantalum wire has a largely improved durability compared to the solid tantalum wire (Sample 1) and the tantalum wire (Sample 3) having the boron nitride formed on the surface thereof. Further, it was confirmed that by performing the energization heating of the catalyst wire by the continuous energization, the generation of surface cracks is suppressed and the service life of the catalyst wire can be prolonged.

Although the embodiments of the present invention have been described above, the present invention is not limited thereto and can be variously modified based on the technical idea of the present invention.

For example, in the embodiments described above, the mixed gas of silane and hydrogen is used as a source gas, but the source gas is not limited thereto and can be changed as appropriate in accordance with types of film-formation materials.

Further, in the embodiments described above, the example has been described in which two substrates S are opposed to each other in the reaction chamber 2 and the plurality of catalyst wires 6 are installed between the two substrates in the vertical direction, but the structure of the reaction chamber 2 is not limited to the above example.

In addition, using the catalytic chemical vapor deposition apparatus of the present invention, it is possible to perform film formation for a p-type layer and an n-type layer of a solar battery.

As an example, a solar battery is manufactured by, first, forming a metal electrode formed of a Mo film or the like on a substrate of glass, aluminum, or the like by sputtering or thermal CVD, then forming a p-type layer (for example, $CuInSe_2$ film) and an n-type layer (for example, CdS film), and forming a transparent electrode formed of ZnO or the like thereon. In this example, using this apparatus, it is possible to form a $CuInSe_2$ film as the p-type layer and a CdS film as the n-type layer.

What is claimed is:

1. A deposition method, comprising:
    preparing a catalyst wire including a tantalum wire and a tantalum boride layer formed on a surface of the tantalum wire, the catalyst wire installed in a reaction chamber;
    heating the catalyst wire;
    introducing a source gas into the reaction chamber, the source gas including a component to be deposited on a substrate installed in the reaction chamber;
    decomposing the source gas by contacting with the heated catalyst wire; and
    depositing the component on the substrate,
    wherein the step of preparing the catalyst wire includes:
        installing the tantalum wire in the reaction chamber;
        heating the tantalum wire to a temperature of 1,700° C. or more;
        introducing a diborane gas into the reaction chamber; and
        forming a tantalum boride layer on a surface of the tantalum wire.

2. The deposition method according to claim 1, wherein in the process of heating the catalyst wire, the catalyst wire is heated to a predetermined temperature of not less than a temperature at which the component is thermally decomposed, the heating is performed by continuous energization during the deposition.

* * * * *